US006747678B1

(12) United States Patent

Katayama et al.

(10) Patent No.: US 6,747,678 B1

(45) Date of Patent: Jun. 8, 2004

(54) AUDIO SYSTEM, ITS CONTROL METHOD AND STORAGE MEDIUM

(75) Inventors: Masaki Katayama, Hamamatsu (JP); Yasuhiro Fujimura, Hamamatsu (JP); Tetsuya Matsuyama, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 898 days.

(21) Appl. No.: 09/594,307

(22) Filed: Jun. 15, 2000

(30) Foreign Application Priority Data

Jun. 15, 1999 (JP) .......................................... 11-169001

(51) Int. Cl.[7] .............................. G06F 3/14; H03G 9/00

(52) U.S. Cl. ....................... 345/773; 345/771; 345/833; 345/727; 345/440; 381/109; 381/106

(58) Field of Search ................................ 345/771, 773, 345/970, 833, 824, 822, 821, 825, 716, 727, 440.2, 440.1, 440; 381/104, 106, 109, 97, 61, 63, 64; 702/66, 67, 68, 71, 79, 107

(56) References Cited

U.S. PATENT DOCUMENTS 5,060,272 A * 10/1991 Suzuki ................... 381/109 X
5,151,998 A * 9/1992 Capps .................... 345/440 X
5,524,060 A * 6/1996 Silfvast et al. .............. 381/104
5,559,301 A * 9/1996 Bryan et al. ............ 345/833 X
5,619,579 A * 4/1997 Ando et al. .................... 381/63
5,666,426 A * 9/1997 Helms .................... 381/104 X
6,067,072 A * 5/2000 Fujishita et al. ............ 345/727
6,359,632 B1 * 3/2002 Eastty et al. ................ 345/716
6,490,359 B1 * 12/2002 Gibson ..................... 381/61 X

FOREIGN PATENT DOCUMENTS

EP 0 571 638 A1 12/1993

* cited by examiner

*Primary Examiner*—Raymond J. Bayerl
(74) *Attorney, Agent, or Firm*—Dickstein, Shapiro, Morin & Oshinsky, LLP.

(57) ABSTRACT

As a desired digital signal processor (DSP) mode is selected from DSP setting buttons displayed in a DSP setting window, only those slide bars for changing parameters of the selected DSP mode are displayed. As a slider bar corresponding to a parameter to be changed is selected from the slide bars displayed in the DSP setting window, an area of an impulse response diagram to be influenced by a change in the parameter value is indicated in a discriminatory manner by an arrow or the like. A user can visually confirm the acoustic effect to be changed by the value of each DSP parameter and can change the parameter value with ease.

13 Claims, 10 Drawing Sheets

AUDIO SYSTEM, ITS CONTROL METHOD AND STORAGE MEDIUM

This application is based on Japanese Patent Application HEI 11-169001, filed on Jun. 15, 1999, the entire contents of which are incorporated herein by reference.

BACKGROUND OF THE INVENTION a) Field of the Invention

The present invention relates to an audio system, its control method, and a storage medium storing programs realizing the control method, and more particularly to an audio system capable of changing acoustic effects by using a digital signal processor (DSP), its control method and a storage medium.

b) Description of the Related Art

FIG. 10 is a block diagram showing an outline structure of an amplifier system used as a conventional stand-alone audio system.

An amplifier system AS has: a CD player terminal T1 to which digital or analog audio signals are input from an external CD player; a tuner terminal T2 to which analog signals are input from an external tuner; a first auxiliary terminal T3; a second auxiliary terminal T4; an input selector SL having unrepresented D/A and A/D convertors; an audio amplifier AM for processing digital audio signals input via the input selector SL by using a digital signal processor (DSP) and amplifying the processed signals, or for amplifying analog audio signals input via the input selector SL, to output to unrepresented speakers via speaker terminals Ts; a CPU for controlling the entirety of the amplifier system AS; a ROM storing programs and data for DSP, various control programs and data; a RAM functioning as a working area for temporarily storing various data; a display DS for displaying various information such as a selected sound source and a DSP mode; and an operation panel PN having various operation keys.

The input selector SL, CPU, ROM, RAM, display DS and operation panel PN are interconnected by a bus (BUS).

The fundamental operation of this amplifier system AS will be described.

If digital signal processing is not executed, a user operates an unrepresented selection switch on the operation panel. The operation state of the operation panel is notified to CPU via the bus. Under the control of CPU, the input selector SL selects one of the connection terminals and connects it to the audio amplifier AM.

The audio amplifier AM amplifies analog or digital signals input from an external apparatus via the input selector SL, and reproduces them as audio sounds which are supplied to speakers via the speaker terminals Ts.

In parallel to this operation, information on the selected sound source (e.g., CD player) and the like is displayed on the display DS.

If digital signal processing is to be executed, a user operates an unrepresented selection switch and an unrepresented DSP mode selection switch on the operation panel. The operation state of the operation panel is notified to CPU via the bus. Under the control of CPU, the input selector SL selects one of the connection terminals, and sequentially stores input and A/D converted analog signals or input digital signals into a RAM for DSP in the audio amplifier AM.

CPU reads a program corresponding to a selected DSP mode (In FIG. 10, four modes "HALL", "JAZZ", "ROCK" and "DISCO" are shown) from ROM, and makes DSP to process the digital audio signals stored in RAM for DSP. The audio amplifier AM amplifies DSPed analog audio signals, and reproduces them as audio sounds to be supplied to speakers via the speaker terminals Ts.

In parallel to this operation, information on the selected sound source (e.g., CD player), selected DSP mode (e.g., "JAZZ") and the like is displayed on the display DS.

In order to realize the acoustic effects of each DSP mode, some makers set the values of DSP parameters before shipping.

An amplifier system having a function of storing various DSP parameters set by a user is also known.

Control of DSP parameters of a conventional amplifier system AS requires expert knowledge, and novices in sounds are hard to understand what acoustic effects can be realized by setting which DSP parameters.

SUMMARY OF THE INVENTION

It is an object of the present invention to solve the above problem and provide an audio system allowing a user to visually understand the acoustic effects given by DSP parameter values and to easily change parameter values, and a control method for the audio system and a storage medium storing programs for realizing the control method.

According to one aspect of the present invention, there is provided an audio system comprising: selection means for selecting one of acoustic effect modes; storage means for storing a value of each of a plurality of parameters corresponding to each acoustic effect mode; model diagram display means for displaying an impulse response model diagram showing impulse response characteristics; parameter operator display means for displaying a parameter operator for changing the parameter value stored in the storage means; and influential area notice means for indicating an influential area of the impulse model diagram, which area corresponding to the impulse response characteristics is influenced by the parameter value changed by operating the parameter operator.

An audio system allowing a user to visually understand the acoustic effects given by DSP parameter values and to easily change parameter values, can be realized and a control method for the audio system and a storage medium storing programs for realizing the control method are also provided.

DETAILED DESCRIPTION OF THE PREFERRED EMBODIMENTS

Figure 1:
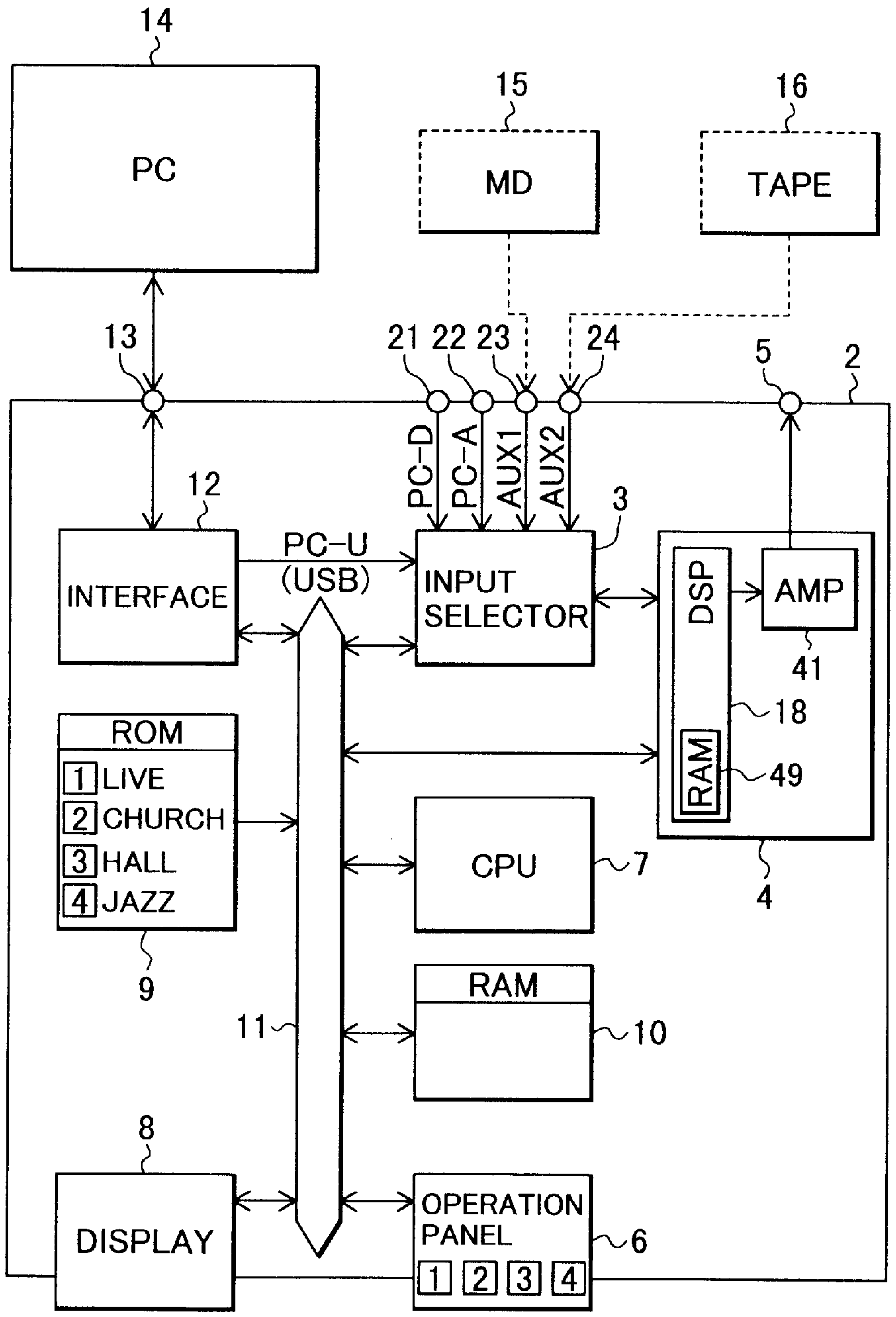
FIG. 1 is a block diagram showing the structure of an audio system according to an embodiment of the invention.

FIG. 1 is a block diagram showing the outline structure of an audio system.

The audio system 1 is mainly constituted of a receiver system (amplifier system with a built-in tuner (not shown) 2 and a personal computer 14 connected to the receiver system 2 via a USB interface 12 for controlling the receiver system 2. Depending upon a user preference, the function of the audio system 1 can be expanded by connecting a mini disc (MD) player 15 to a first auxiliary connection terminal 23, a tape deck 16 to a second auxiliary connection terminal 24, or the like, as will be later described.

As shown in FIG. 1, the receiver system 2 has following signal connection terminals. A digital audio signal connection terminal 21 to which digital audio signals are input from a sound card of the personal computer 14. An analog audio signal connection terminal 22 to which analog audio signals are input from the sound card of the personal computer 14. The first auxiliary connection terminal 23 to which digital or analog audio signals are input from an external digital audio recording/reproducing apparatus such as an MD player 15. The second auxiliary connection terminal 24 to which analog audio signals are input from an external analog audio recording/reproducing apparatus such as a tape deck 16.

The receiver system 2 is constituted of the following components. An input selector 3 having unrepresented D/A and A/D convertors, input to which selector are USB audio signals PC-U from the USB interface 12 to be described later. An audio amplifier 4 for processing digital audio signals input via the input selector 3 by using a digital signal processor DSP having a digital signal processing function and amplifying the processed signals, or for amplifying analog audio signals input via the input selector 3, to output to unrepresented speakers via speaker terminals 5. A DSP 18 having a digital signal processing function. A RAM 49 functioning as a working area for the audio amplifier 4 for temporarily storing various data. An operation panel 6 having various operation keys. A CPU 7 for controlling the entirety of the receiver system 2. A display 8 for displaying various information such as a selected sound source and a DSP mode. A ROM 9 storing programs and data for DSP, various control programs and data. A RAM 10 functioning as a working area for temporarily storing various data. The USB interface 12 for performing an interface operation with the personal computer 14 via a USB connection terminal 13, i.e., for transferring a control signal to and from a bus 11 and outputting audio signals PC-U to the input selector 3.

The input selector 3, audio amplifier 4, operation panel 6, CPU 7, display 8, ROM 9, RAM 10, and USB interface 12 are interconnected by the bus (BUS) 11.

ROM 9 stores initial values of various data.

Immediately after the receiver system 2 is activated, initial values of various data are copied from ROM 9 to the working area of RAM 10. DSP parameter values and the like set by a user and stored in RAM 10 can be updated freely and the updated parameter values and the like can be stored for a long time by battery backup.

The personal computer 14 can switch DSP modes of the receiver system 2, change the values of a plurality type of parameters which can be set independently for each DSP mode, and execute a change/register process of changing/registering the value of each parameter in the working area of RAM 10 via the USB connection terminal 13 and USB interface 12.

The personal computer 14 can display a model diagram of impulse response characteristics preset for each DSP mode. A user can therefore visually confirm the acoustic characteristics of each DSP mode.

An impulse response is represented by a change with time in a waveform of a sound pressure measured at a sound reception site when a pulse sound is generated in a room.

When the value of each parameter of a DSP mode is changed from the personal computer 14, only the operators (e.g., slide bars) of parameters which can be changed in the DSP mode selected by a user are displayed on the setting screen, whereas the operators of parameters which influence not so much the acoustic characteristics of the selected DSP mode are not displayed. This will be later described by using a specific operation example of a DSP mode selection.

As a user selects an operator of a parameter desired to be changed, an area of an impulse response model diagram in a setting window, whose acoustic characteristics are influenced by the parameter and its value to be changed by operating the slide bar, is indicated by an arrow or the like.

Figure 2:
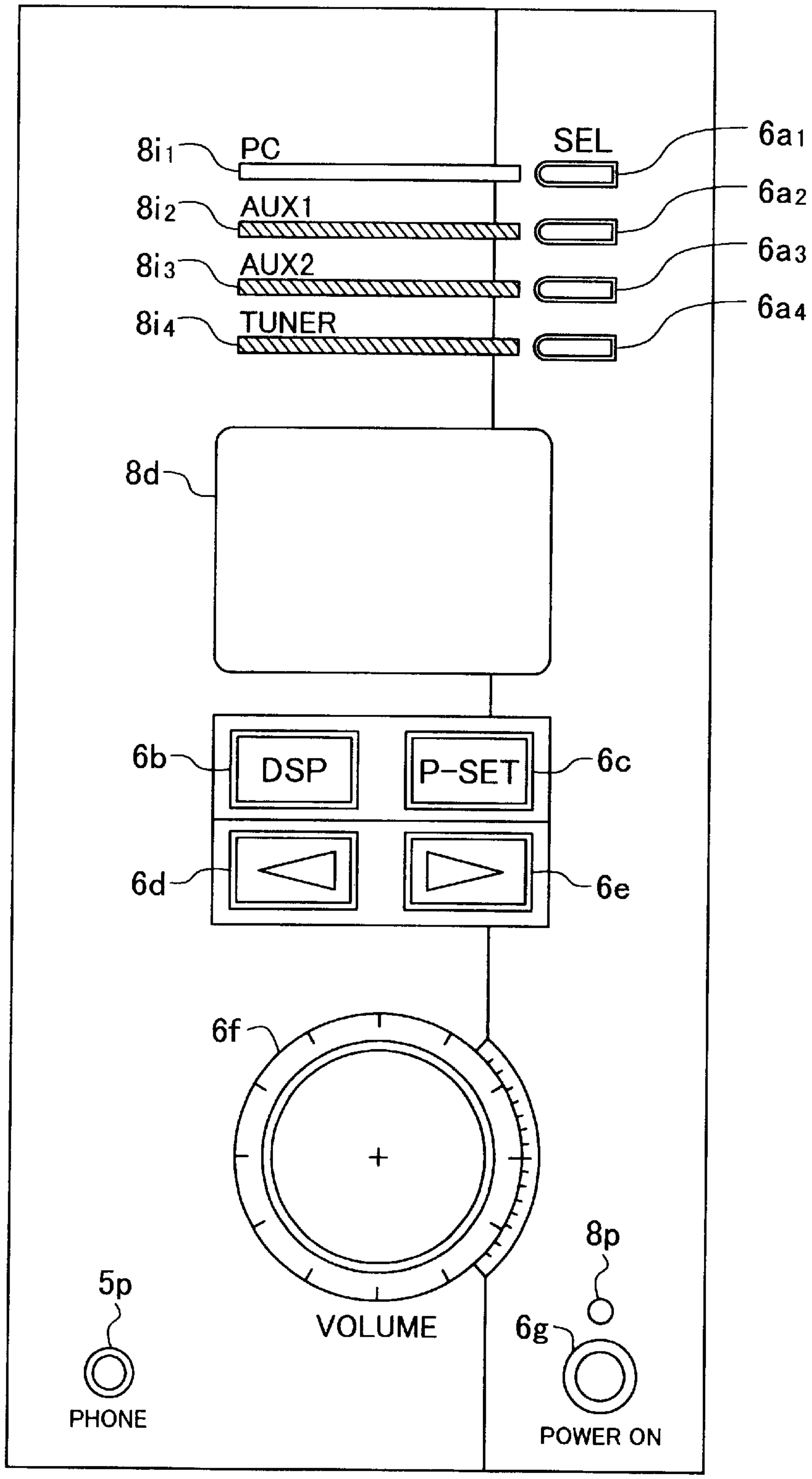
FIG. 2 is a diagram showing an example of a front panel of the audio system of the embodiment.

FIG. 2 is a diagram showing the front panel of the receiver system 2.

A plurality of switches constituting a portion of the operation panel 6 are provided on the front panel of the receiver system 2.

More specifically, the switches provided on the front panel of the receiver system 2 include: selector switches **6*a*1 to 6*a*4 for selecting a sound source; a DSP switch 6*b* for activating a DSP function; a preset P-SET switch 6*c* for selecting a preset tuning function of a tuner, this switch 6*c* capable of being turned on while the DSP function is not activated by the DSP switch 6*b*; a pair of up/down switches 6*d* and 6*e* functioning as DSP mode selection switches while the DSP switch 6*b* is on and functioning as tuning switches while the preset P-SET switch 6*c* is on; a volume switch 6*f*; and a power switch 6*g* for turning on and off the power of the receiver system 2**.

A headphone jack **5*p* is mounted on the front panel of the receiver system 2** to connect a headphone.

Display elements constituting a portion of the display 8 are mounted on the front panel of the receiver system 2.

More specifically, the display elements mounted on the front panel of the receiver system 2 include: a multi-function display unit **8*d*, first to fourth indicators 8*i*1 to 8*i*4, and a power indicator 8*p*. The multi-function display unit 8*d* is used for displaying various information and may be a dot matrix transmission liquid crystal display with a back light or a fluorescent luminescence display. The first indicator 8*i*1 is turned on when the presently connected sound source is the sound card of the personal computer 14 connected via the digital audio signal connection terminal 21 or analog audio signal connection terminal 22, or when the USB connection terminal 23 is used. The second indicator 8*i*2 is turned on when the presently connected sound source is an external audio recording/reproducing apparatus connected to the first auxiliary connection terminal 23. The third indicator 8*i*3 is turned on when the presently connected sound source is an external audio recording/reproducing apparatus connected to the second auxiliary connection terminal 24. The fourth indicator 8*i*4 is turned on when the presently selected sound source is a built-in tuner. The power indicator 8*p* is turned on when the power of the receiver system 2** is turned on.

Figure 3:
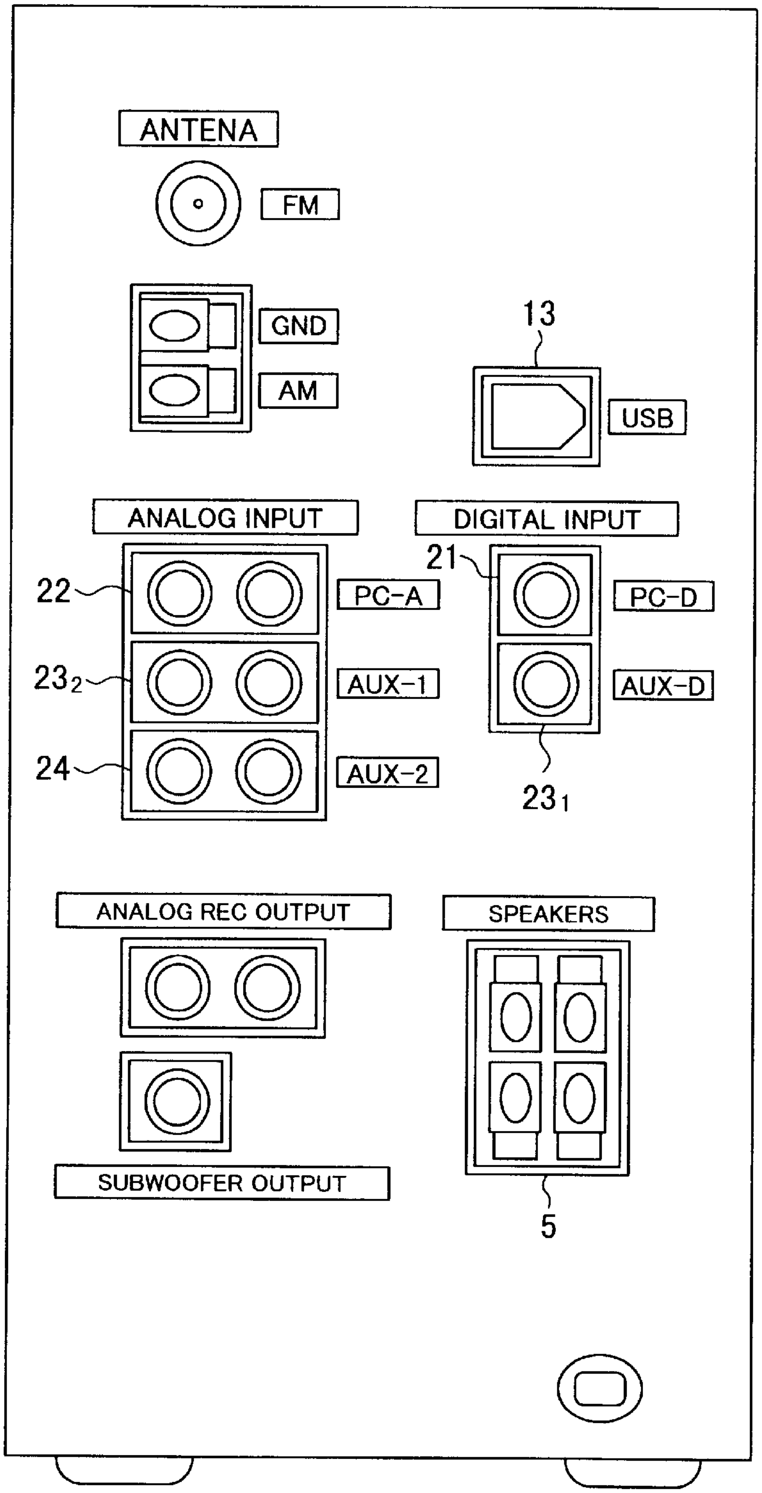
FIG. 3 is a diagram showing an example of a rear panel of the audio system of the embodiment.

FIG. 3 is a diagram showing the rear panel of the receiver system 2.

On the rear panel of the receiver system 2, the speaker terminals 5, digital audio signal connection terminal 21, analog audio signal connection terminal 22, first and second auxiliary connection terminals 23 and 24, USB connection terminal 13 described previously, and other terminals are mounted. The other terminals include: a digital audio signal auxiliary connection terminal $\mathbf{23}_1$, for inputting digital audio signals from an external digital recording/reproducing apparatus; an analog audio signal auxiliary connection terminal $\mathbf{23}_2$ for inputting analog audio signals from an external analog digital recording/reproducing apparatus; antenna terminals (FM antenna terminal, AM antenna terminal, ground terminal); analog audio signal output terminals, and a subwoofer connection terminal.

Next, examples of specific operations will be described with reference to FIGS. 4 and 5, which operations are executed on the side of the personal computer 14 of the audio system 1 when a DSP mode is selected.

Figure 4:
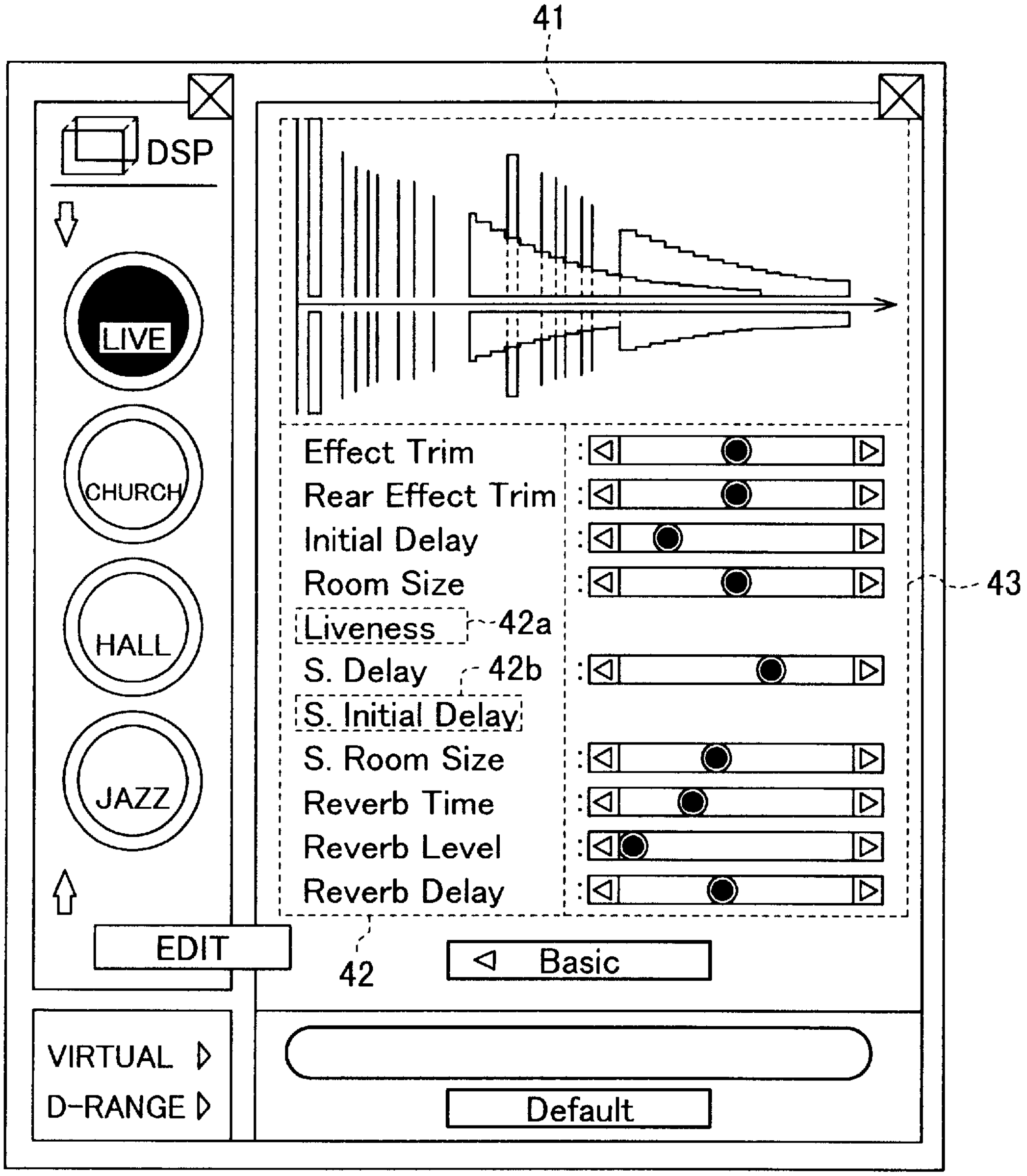
FIG. 4 is a diagram showing an example of a DSP setting window when a DSP mode is selected from a personal computer of the audio system of the embodiment.

FIG. 4 shows an example of a DSP setting window displayed on a display of the personal computer 14 when a "LIVE" mode is selected from DSP modes.

A display program for displaying the DSP setting window, a program for data transfer to and from the receiver system 2 via USB, and the like are supplied to the personal computer 14 by using a storage medium such as a CD-ROM.

Reference numeral 41 shown in FIG. 4 represents a model diagram of impulse response characteristics preset for each DSP mode. The ordinate represents a "level" of sound pressure, and the abscissa represents a "time". It is possible to visually recognize how a pulse sound changes with time.

Figure 9A:
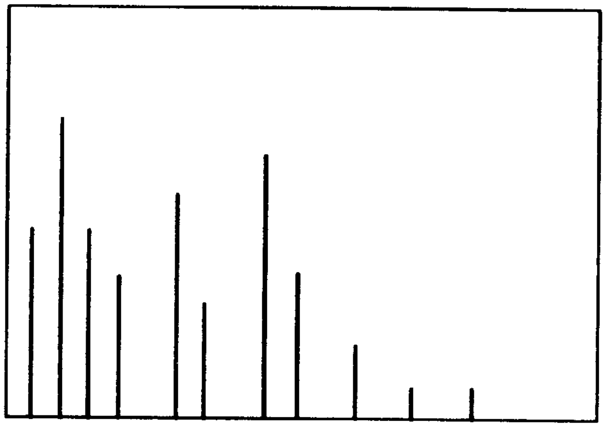
FIGS. 9 are diagrams showing impulse responses of DSP modes of the audio system of the embodiment.
Figure 9B:
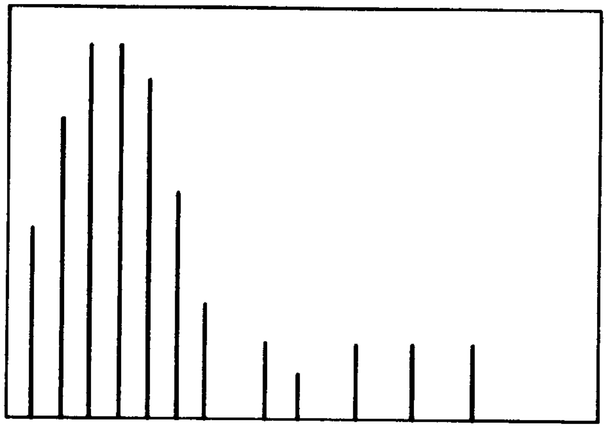
Figure 10:
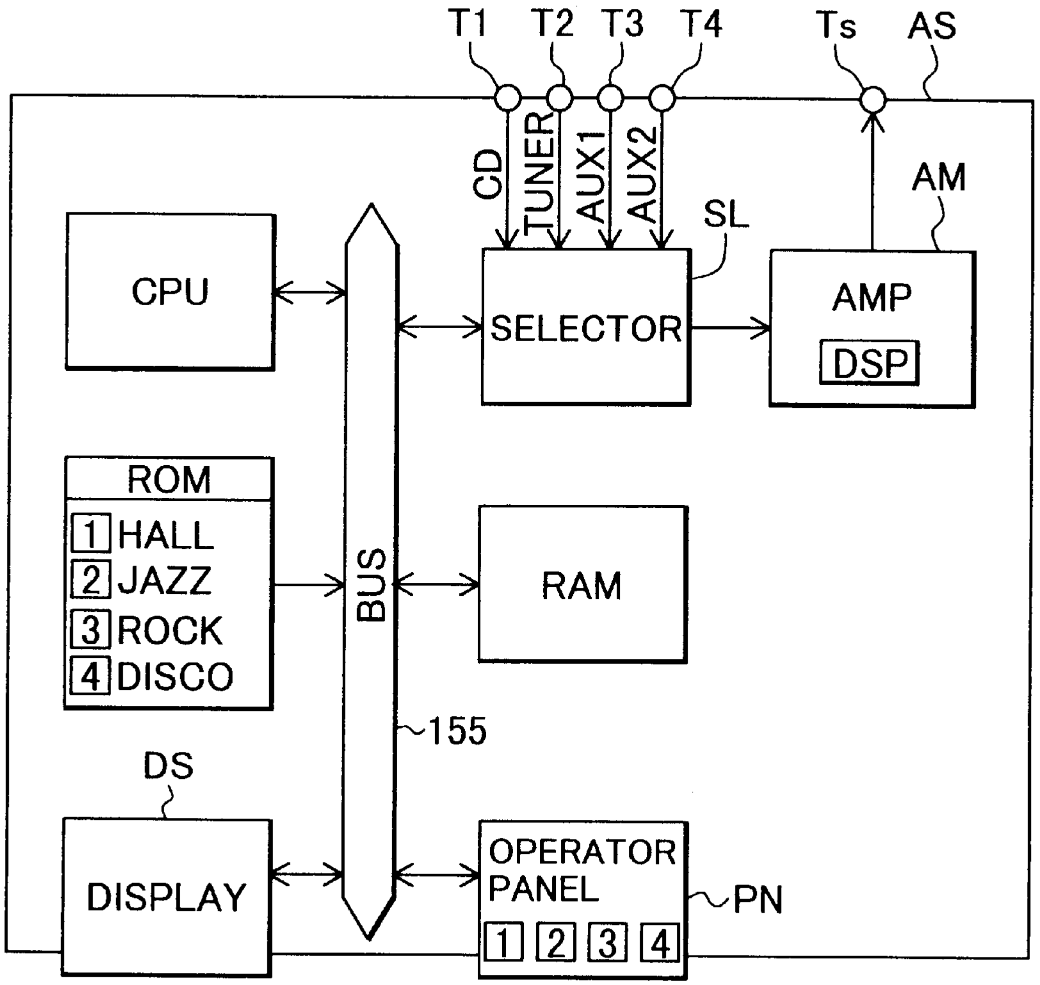
FIG.10 PRIOR ART
FIG. 10 is a diagram showing the structure of a conventional audio system.

This model diagram is preset for each DSP mode. Specifically, as shown in FIGS. 9A and 9B, different model diagrams for respective modes, e.g., DSP mode A (FIG. 9A) and DSP mode B (FIG. 9B) are displayed in the DSP setting window.

The model diagram for each DSP mode is stored in a CD-ROM or the like, and read when necessary by the personal computer 14 to be displayed on its display.

Names of parameters are displayed in a parameter column 42.

A parameter operator is displayed in a parameter operator column 43.

The parameter operator is used for setting a parameter value of the corresponding parameter displayed in the parameter column 42. In the example shown in FIG. 4, a slide bar is used as the parameter operator. The slide bar shows a relative parameter value.

Of the parameters displayed in the parameter column 42, a "Liveness" parameter **42*a* and an "S. Initial Delay" parameter 42*b* whose slide bars are not displayed in the parameter operator column 43** cannot be used in the "LIVE" mode.

This is because the values of the "Liveness" parameter **42*a* and "S. Initial Delay" parameter 42*b*** do not influence the acoustic characteristics of the "LIVE" mode or hardly influence so that the operation by the parameter operator is made disabled.

Since some slide bars are not displayed, a user can change only the parameter values necessary for the selected DSP mode and it becomes easy to adjust the acoustic characteristics by changing the necessary parameter values.

Figure 5:
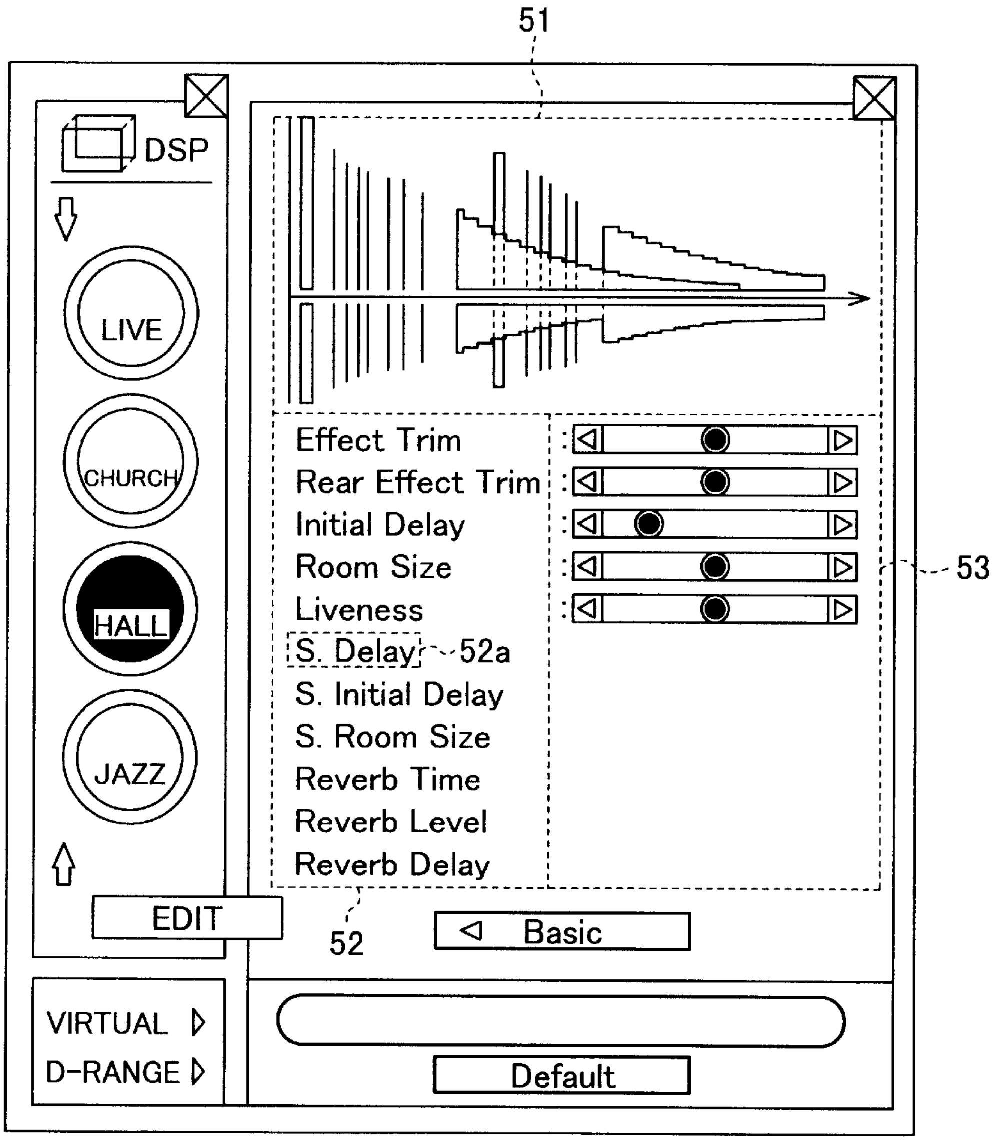
FIG. 5 is a diagram showing another example of a DSP setting window when a DSP mode is selected from the personal computer of the audio system of the embodiment.

FIG. 5 shows an example of a DSP setting window displayed on a display of the personal computer 14 when a "HALL" mode is selected from DSP modes.

In FIG. 5, of the parameters displayed in a column 52, an "S. Delay" parameter **52*a* and those parameters under the parameter 52*a* whose slide bars are not displayed in a parameter operator column 53** cannot be used in the "HALL" mode.

This is because the values of the "S. Delay" parameter **52*a*** and following parameters do not influence the acoustic characteristics of the "HALL" so that the operation by the parameter operator is made disabled.

Since some slide bars are not displayed, a user can change only the parameter values necessary for the selected DSP mode and it becomes easy to adjust the acoustic characteristics by changing the necessary parameter values.

Next, examples of specific operations will be described with reference to FIGS. 6 and 7, which operations are executed on the side of the personal computer 14 of the audio system 1 to select a desired slide bar and operate the operator.

Figure 6:
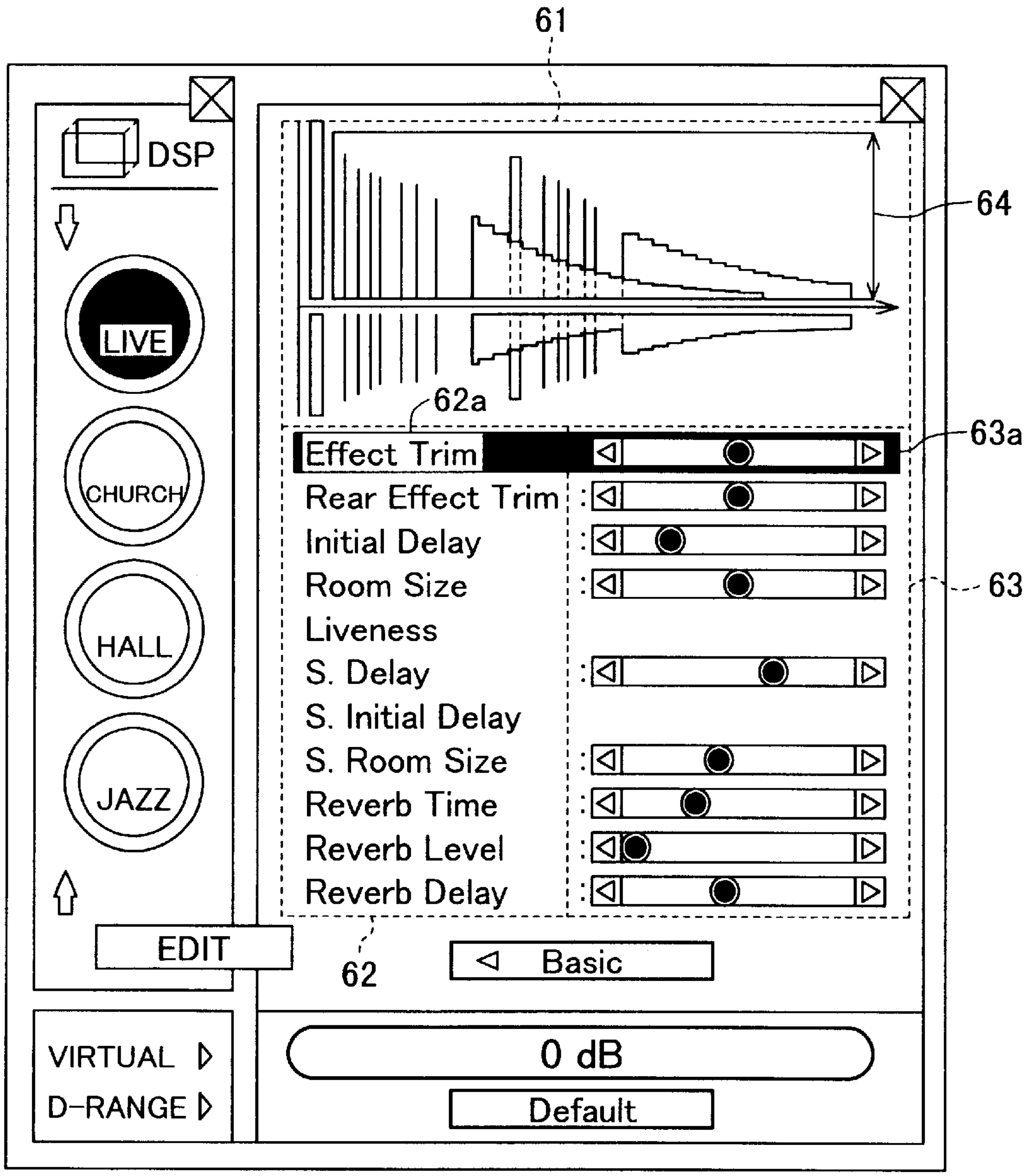
FIG. 6 is a diagram showing an example of a DSP setting window when a parameter operator is selected from a personal computer of the audio system of the embodiment.

FIG. 6 shows an example of a DSP setting window displayed when a slide bar **63*a* corresponding to an "Effect Trim" parameter 62*a* in a parameter operator column 63** is selected (for example, pointed (clicked) with a mouse).

The acoustic characteristics in an (influential) area of the model diagram enclosed by a line indicated by a double-head arrow 64 can be influenced by changing the value of the "Effect Trim" parameter **62*a***. In this manner, the influence of the parameter value can visually confirmed.

The levels of sounds in the area of the model diagram enclosed by the line indicated by the arrow 64 can be adjusted.

In this example, the value of the "Effect Trim" parameter **62*a* is 0 dB as shown in FIG. 6**.

Figure 7:
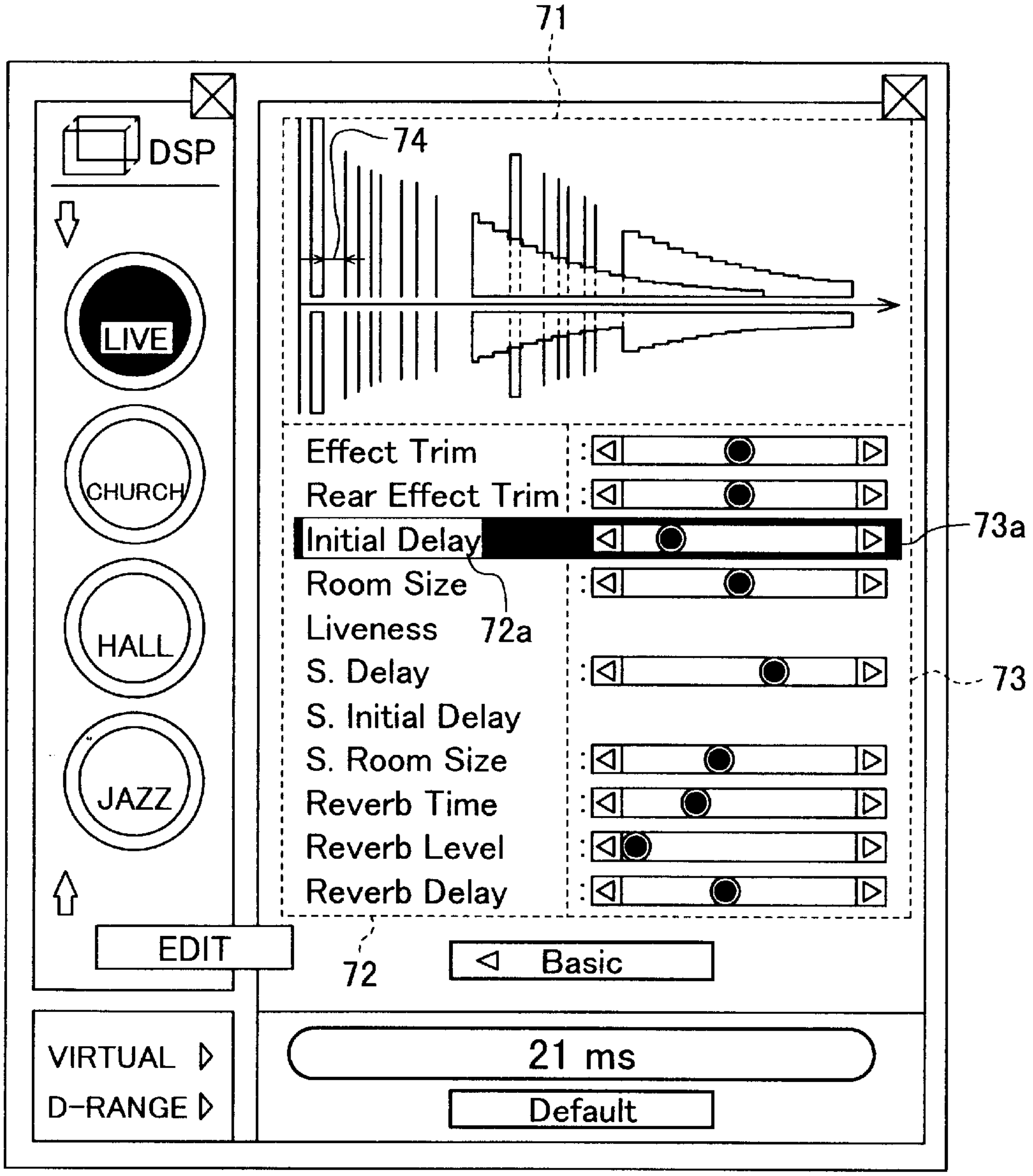
FIG. 7 is a diagram showing another example of a DSP setting window when a parameter operator is selected from the personal computer of the audio system of the embodiment.

FIG. 7 shows an example of a DSP setting window displayed when a slide bar **73*a* corresponding to an "Initial Delay" parameter 72*a* in a parameter operator column 73** is selected.

The acoustic characteristics in an (influential) area (a space between first and second pulses) of the model diagram indicated by an inward double-head arrow 74 can be influenced by changing the value of the "Initial Delay" parameter **72*a***. In this manner, the influence of the parameter value can visually confirmed.

In this example, the value of the "Initial Delay" parameter **72*a* is 21 ms as shown in FIG. 7**.

As described above, an area of the model diagram whose acoustic characteristics can be influenced by the parameter and its value to be changed by operating the slide bar, is indicated by an arrow or the like. It is therefore possible for a user to visually confirm the influence of each parameter and its value to be changed by operating the slide bar.

Figure 8:
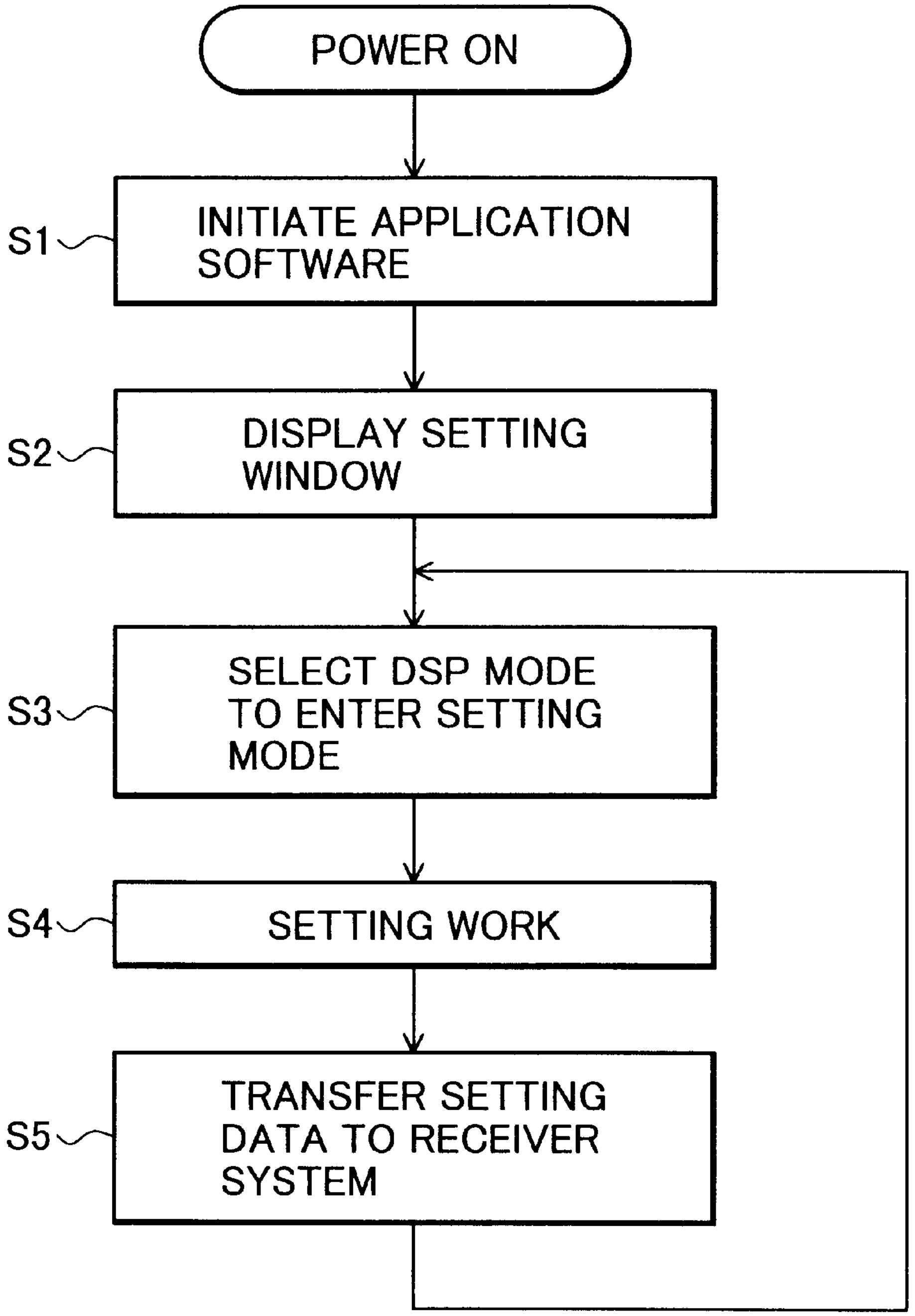
FIG. 8 is a flow chart illustrating an operation to be executed by the audio system of the embodiment.

Next, an example of an operation of setting a DSP mode on the side of the personal computer 14 of the audio system 1 will be described with reference to the flow chart of FIG. 8. In this description, the DSP setting window shown in FIG. 7 is also referred to when necessary.

At Step S1, the power is turned on to activate the personal computer 14 and initiate application software for DSP setting.

At Step S2, a DSP setting window such as shown in FIG. 7 is displayed on the display of the personal computer 14.

At Step S3, a user selects a desired DSP mode from the DSP setting window.

More specifically, when the "LIVE" mode is selected from the DSP setting buttons displayed in the DSP setting window shown in FIG. 7, only those slider bars corresponding to changeable parameters in the "LIVE" mode are displayed on the DSP setting window.

At Step S4, the user selects a desired slider bar from the slider bars displayed on the DSP setting window, and changes the value of the parameter corresponding to the selected slider bar.

More specifically, if a desired slide bar, e.g., the slide bar 73*a* corresponding to the "Initial Delay" parameter 72*a*, is selected from the slide bars displayed on the DSP setting window shown in FIG. 7, and if the value of the "Initial Delay" parameter 72*a* is changed, then the arrow 74 is displayed in the influential area of the model diagram 71.

Since the arrow 74 is displayed in the model diagram 71, a user can change the parameter value after visually confirming the influence of a change in the value of the "Initial Delay" parameter 72*a* upon the acoustic characteristics of the audio system 1.

At Step S5, the changed value of each parameter in the "LIVE" mode is transferred via USB to the receiver system 2 of the audio system 1.

Upon reception of the changed value of each parameter in the "LIVE" mode, the receiver system 2 of the audio system 1 stores the received changed value in the working area of RAM 10. When the "LIVE" mode is selected again thereafter, the acoustic process is executed in accordance with the stored changed parameter values.

According to the embodiment described above, only the slide bars related to the parameters necessary for the user selected DSP mode are displayed. Accordingly, the user can easily change acoustic effects as desired in the selected DSP mode. Even novices in DSP parameters can enjoy acoustic effects easily.

The area of the model diagram which influences the acoustic characteristics when the value of each parameter is changed by the user selected parameter operator, is displayed in a discriminatory manner. It is therefore possible to visually confirm the area of the model diagram which influences the acoustic characteristics. Even novices not familiar with sounds can confirm the acoustic characteristics with ease.

In the embodiment described above, the arrow is displayed in the model diagram of the impulse response characteristics of each DSP mode when a user tries to change the parameter value of each DSP mode. This arrow may be elongated or shortened in accordance with the changed parameter value. For example, the arrow or the like indicating the area of the model diagram of the acoustic characteristics to be influenced by changing the value of the "Initial Delay" parameter may be elongated or shortened in accordance with the changed parameter value.

Also in the embodiment described above, the model diagram of the impulse response characteristics preset for each DSP mode is displayed. The model diagram of the impulse response characteristics may be newly generated in accordance with the changed values of parameters of each DSP mode and displayed in the DSP setting window. For example, only a model diagram of the impulse response which is influenced by the changed value of "Initial Delay" parameters of the "LIVE" mode may be newly generated and displayed.

The present invention has been described in connection with the preferred embodiments. The invention is not limited only to the above embodiments.

It is apparent that various modifications, improvements, combinations, and the like can be made by those skilled in the art.

What is claimed is:

1. An audio system comprising:

selection means for selecting one of acoustic effect modes;

storage means for storing a value of each of a plurality of parameters corresponding to each acoustic effect mode;

model diagram display means for displaying an impulse response model diagram showing impulse response characteristics;

parameter operator display means for displaying a parameter operator for changing the parameter value stored in said storage means; and influential area notice means for indicating an influential area of the impulse model diagram, which area corresponding to the impulse response characteristics is influenced by the parameter value changed by operating the parameter operator.

2. An audio system according to claim 1, wherein said model diagram display means displays the impulse response model diagram preset for each acoustic effect mode to be selected.

3. An audio system according to claim 1, wherein said model diagram display means includes model diagram generating means for generating a new impulse response model diagram in accordance with a selected acoustic effect mode and a changed parameter value, and displays the impulse response model diagram newly generated by said model diagram generating means.

4. An audio system according to claim 1, wherein said parameter operator display means includes parameter operator display inhibition means for inhibiting a display of parameter operators other than parameter operators predetermined for each acoustic effect mode to be selected.

5. An audio system according to claim 1, wherein an information processing terminal comprises said model diagram display means, said parameter operator display means and said influential area notice means.

6. A control method for an audio system comprising:

a selection step of for selecting one of acoustic effect modes;

a model diagram display step of displaying an impulse response model diagram showing impulse response characteristics;

a parameter operator display step of displaying a parameter operator for changing a value of each of a plurality of parameters corresponding to each acoustic effect mode and stored in a storage unit; and an influential area notice step of indicating an influential area of the impulse model diagram, which area corresponding to the impulse response characteristics is influenced by the parameter value changed by operating the parameter operator.

7. A control method for an audio system according to claim 6, wherein said model diagram display step displays the impulse response model diagram preset for each acoustic effect mode to be selected.

8. A control method for an audio system according to claim 6, wherein said model diagram display step includes a model diagram generating step of generating a new impulse response model diagram in accordance with a selected acoustic effect mode and a changed parameter value, and displays the impulse response model diagram newly generated by said model diagram generating step.

9. A control method for an audio system according to claim 6, wherein said parameter operator display step includes a parameter operator display inhibition step of inhibiting a display of parameter operators other than parameter operators predetermined for each acoustic effect mode to be selected.

10. A storage medium storing a control program for an audio system, the control program comprising:

a selection step of for selecting one of acoustic effect modes;

a model diagram display step of displaying an impulse response model diagram showing impulse response characteristics;

a parameter operator display step of displaying a parameter operator for changing a value of each of a plurality of parameters corresponding to each acoustic effect mode and stored in a storage unit; and an influential area notice step of indicating an influential area of the impulse model diagram, which area corresponding to the impulse response characteristics is influenced by the parameter value changed by operating the parameter operator.

11. A storage medium storing a control program for an audio system according to claim 10, wherein said model diagram display step displays the impulse response model diagram preset for each acoustic effect mode to be selected.

12. A storage medium storing a control program for an audio system according to claim 10, wherein said model diagram display step includes a model diagram generating step of generating a new impulse response model diagram in accordance with a selected acoustic effect mode and a changed parameter value, and displays the impulse response model diagram newly generated by said model diagram generating step.

13. A storage medium storing a control program for an audio system according to claim 10, wherein said parameter operator display step includes a parameter operator display inhibition step of inhibiting a display of parameter operators other than parameter operators predetermined for each acoustic effect mode to be selected.

* * * * *